United States Patent [19]
Mayer

[11] Patent Number: 6,159,832
[45] Date of Patent: Dec. 12, 2000

[54] PRECISION LASER METALLIZATION

[76] Inventor: Frederick J. Mayer, 1417 Dicken Dr., Ann Arbor, Mich. 48103

[21] Appl. No.: 09/040,610

[22] Filed: Mar. 18, 1998

[51] Int. Cl.$^7$ ............................. H01L 21/20; C23C 14/14
[52] U.S. Cl. ........................... 438/584; 427/597; 438/940
[58] Field of Search ............................. 427/597; 438/584, 438/940

[56] References Cited

U.S. PATENT DOCUMENTS

| | | | |
|---|---|---|---|
| 4,743,463 | 5/1988 | Ronn et al. | 427/53.1 |
| 4,752,455 | 6/1988 | Mayer | 427/597 |
| 4,880,959 | 11/1989 | Baum et al. | 219/121.85 |
| 4,895,735 | 1/1990 | Cook | 427/43.1 |
| 4,970,196 | 11/1990 | Kim et al. | 505/1 |
| 4,987,006 | 1/1991 | Williams et al. | 427/53.1 |
| 5,035,202 | 7/1991 | Nishikawa et al. | 118/727 |
| 5,173,441 | 12/1992 | Yu et al. | 437/173 |

(List continued on next page.)

OTHER PUBLICATIONS

Mallis et al., "Etching and printing of diffractive optical microstructures by a femtosecond excimer laser," Applied Optics, vol. 38, No. 11, pp. 2301–2308, Apr. 1999.

Liu et al., "Ultrashort laser pulses tackel precision machining, " Laser Focus World, pp. 101–118, Aug. 1997.

Liu et al., "Laser Ablation and Micromachining with Ultrashort Laser Pulses," IEEE Journal of Quantum Electronics, vol. 33, No. 10, pp. 1706–1716, Oct. 1997.

Perry et al., "Terawatt to Petawatt Subpicosecond Lasers," Science, vol. 264, pp. 917–924, May 1994.

F. J. Mayer and Gar. E. Busch, "Plasma production by laser–driven explosively heated thin metal films", Journal of Applied Physics, 57, 827 (1985), pp. 827–829.

A. B. Bullock, P. R. Bolton, and F. J. Mayer, "Time–integrated reflectivity of laser–induced back ablated aluminum thin film targets", Journal of Applied Physics, 82, 1828 (1997), pp. 1828–1831.

F. J. Adrian, J. Bohandy, B. F. Kim, and A. N. Jette, "A study of the mechanism of metal deposition by the laser–induced forward transfer process", Journal of Vacuum Science and Technology B 5, 1490 (1989), pp. 1490–1494.

Z. Toth, T. Szorenyi and A. L. Toth, "Ar$^+$ laser–induced forward transfer (LIFT): a novel method for micrometer–size surface patterning", Applied Surface Science 69,317 (1993), pp. 317–320.

H. Esrom, J. Y. Zhang, U. Kogelschatz and A. J. Pedraza, "New approach of a laser–induced forward transfer for deposition of patterned thin metal films", Applied Surface Science 86, 202 (1995), pp. 202–207.

R. J. Baseman, A. Gupta, R.C. Sausa and C. Progler, in: Laser and Particle Beam Chemical Processing for Microelectronics, Eds. D. J. Ehrlich, G. S. Higashiand and M. M Oprysko, materials Research Society Symposium Proceedings 101, 237 91988), pp. 237–242.

W. H. Knox, "Practical Lasers Will Spawn Varied Ultrafast Applications" in Laser Focus World, p. 135, Jun. 1996, pp. 135–140.

Clark–MXR Inc., Dexter, Michigan, also the following publication, P. Bado, D. Du, E.F. Gabl, Y. Pang, E. Canto–Said, "Reliable Compact Ultrafast Sources", Ultrafast Phenomena, Tenth International Topical Meeting, May 28–Jun. 1, 1996.

Tolbert, W. A., Lee, S. I–Y., Wen, X., and Dlott, D., "Laser Ablation Transfer Imaging Using Picosecond Optical Pulses: Ultra–High Speed, Lower Threshold and Higher Resolution", Journal of Imaging Science and Technology 37, pp. 485–489 (1993).

(List continued on next page.)

Primary Examiner—Brian Dutton
Attorney, Agent, or Firm—Gifford, Krass, Groh, Sprinkle, Anderson & Citkowski, P.C.

[57] ABSTRACT

A process for providing precision deposits (3) of metal films unto a working substrate (5) by transmitting an ultrafast laser pulse thorough a transparent target substrate (6) whose lower surface supports a metal film (7). Rapid laser heating produces pressure that propels vaporized metal unto the working substrate whereupon the metal vapor rapidly resolidifies on a dimension substantially equal to the ultrafast laser's focal spot size.

11 Claims, 4 Drawing Sheets

U.S. PATENT DOCUMENTS

| | | | |
|---|---|---|---|
| 5,246,885 | 9/1993 | Braren et al. | 437/225 |
| 5,292,559 | 3/1994 | Joyce et al. | 427/597 |
| 5,725,706 | 3/1998 | Thoma et al. | 156/150 |
| 5,912,915 | 6/1999 | Reed et al. | 372/93 |
| 5,935,462 | 8/1999 | Tatah | 219/121.6 |
| 5,956,354 | 9/1999 | Yan | 372/18 |

OTHER PUBLICATIONS

Abstract of Paper CThA4 at the Conference of Lasers and Electro–Optics (Europe)—1998 p. 248, Papakonstantinou, P., Zergioti, I., Mailis, S., Ikiades, A., Kalpouzos, C., Vainos, N., "Femtosecond Laser Microprinting of Metal and Oxide Structures".

Part of PhD thesis of An–Chun Tien submitted to the University of Michigan, Mar. 1999, pp. 62–69.

PRECISION LASER METALLIZATION

FIELD OF THE INVENTION

This invention relates to the process of laser-driven, direct-deposition of electrically conducting films onto substrates, specifically, to the precision deposition of electrically conducting films on microelectronic and optoelectronic substrates, photolithographic masks, and other surfaces.

DESCRIPTION OF THE PRIOR ART

Many processing steps in semiconductor manufacture and micromachining require that a thin film of metal be deposited upon a surface in a controlled and precision manner. One early method for depositing a thin metal film uses laser-thermal or photo-decomposition of organometallic gases above substrate surfaces. This continuous laser-thermal method, summarized in the book by Ibbs and Osgood[1], is currently used for some metallization applications, yet in practice it suffers from at least three disadvantages. First, metal atoms generated in the gas phase above the substrate tend to spread over the surface away from the region of decomposition. Second, the process is relatively slow. Third, only those metals having an appropriate organometallic gas can be used. These problems make rapid, precise metallization by this method impractical for many microelectronics and microstructuring applications. Furthermore, this method inherently has an associated environmental problem of requiring safe handling and disposal of some toxic organometallic gases and structures.

A second method of laser metallization makes use of direct laser-driven metal ablation from a target substrate to a working substrate. In the present patent application, I will refer to this second method as micro-structuring by explosive laser deposition (MELD). Variations of the MELD method had previously been proposed for numerous metallization applications such as:

(1) deposition of a thin metal line upon a semiconductor substrate as an electrical conducting path as in U.S. Pat. No. 5,246,885 to Braren et al. (1993), and U.S. Pat. No. 4,880,959 to Baum et al. (1989);

(2) deposition of a small scale thin-metal layer that obscures light transmitted through a photolithographic mask as in U.S. Pat. No. 5,173,441 to Yu et al. (1992);

(3) deposition of a thin metal layer upon a piezoelectric crystal for fine-tuning its resonant frequency as in U.S. Pat. No. 5,035,202 to Nishikawa et al. (1991).

These examples make use of a pulsed high-power laser ablation process as taught in my U.S. Pat. No. 4,752,455 (1988) and in others such as U.S. Pat. No. 4,970,196 to Kim et al. (1990); U.S. Pat. No. 4,895,735 to Cook (1990); U.S. Pat. No. 5,292,559 to Joyce et al. (1994) and U.S. Pat. No. 4,987,006 to Williams et al. (1991). However, this MELD metallization method has not been widely used in applications for a number of reasons I discuss below.

Figure 1A:
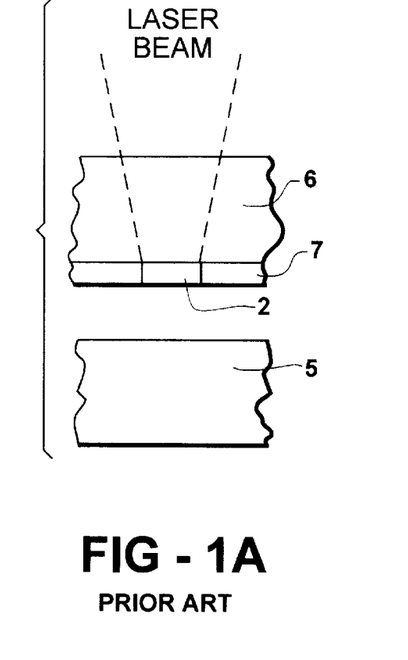
Figure 1B:
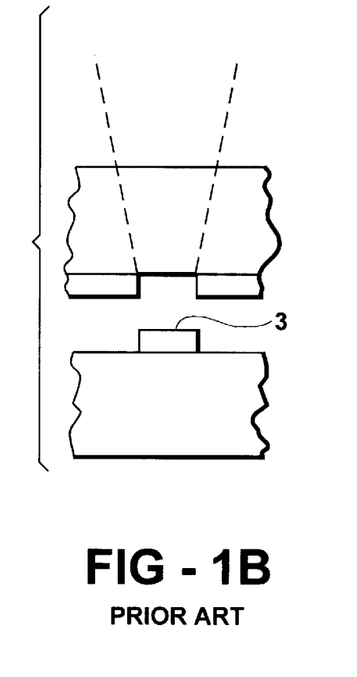
Figure 1C:
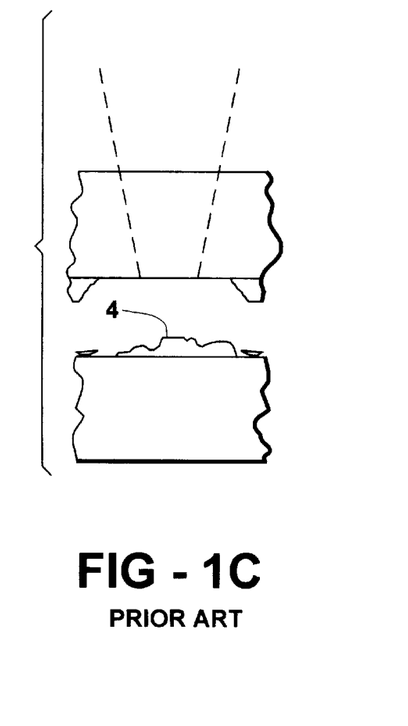

The physical process of forward-directed laser-driven metal ablation has been described in some of my technical journal articles[2,3] and for some experiments on deposition by others[4,5,6,7]. FIGS. 1-A and 1-B show schematically how the laser thin-metal deposition process was expected to work in the prior art. FIG. 1-C shows schematically how it actually worked in practice. FIG. 1-A shows the laser pulse transmitted through the target substrate 6 just as it is being absorbed by the metal layer 7 under the laser focal spot 2. FIG. 1-B shows the metal 3 that was heated and explosively driven onto the working substrate 5 was expected to be of the same lateral dimension as the laser focal spot. In laboratory experiments, however, the metal on the target substrate was heated over a dimension larger than the focal spot making the metal deposit 4 on the working substrate 5 too large and irregular. Depending upon the distance between the target and working substrates, this spreading of the dimensions of the transferred metal layer limited the usefulness of laser metallization applications particularly those requiring high precision.

There were two reasons for the extended metal heating zone on the target substrate. First, the laser pulse lengths were, by today's standards, quite long—greater than 100 picoseconds (1 ps=$10^{-12}$ s) and in many cases were greater than 10 nanoseconds (1 ns=$10^{-9}$ s). At these pulse lengths, the plasma at the interface between the metal film and the target substrate continues to be heated long after the metal layer has been explosively accelerated. The late heating carries energy into the metal film outside of the laser focal spot (perpendicular to the laser direction) by electron thermal conduction. Second, the late heating produces hydrodynamic instabilities in the expanding plasma which produces metal plasma spreading and density irregularities before it resolidifies on the working substrate.

Many metallized patterns could be created by incrementally advancing the target substrate and the working substrate between a succession of laser pulses. But, both the irregular metal deposits and deposit spreading created by the long-pulse lasers (Q-switched and mode-locked systems) of the prior art and practice made this method either impractical or lacking in precision.

In addition to the problems mentioned above, there are additional problems which precluded using the MELD method from previously being employed in microelectronics metallization and other applications:

(a) the metal removal outside of the focal spot diameter required more movement of the target substrate for the next laser pulse and necessarily more metal wasted between laser pulses (b) the pulse repetition rate (a few Hz) for many available lasers was too low for production applications (c) the pulse-to-pulse repeatability for the available lasers was poor which produced poor quality metal depositions (d) the focused laser spot sizes were too large for precision, fine-scale applications (e) the long laser pulses produced long metal deposition pulses on the working substrate which produced damage to nearby locations on the substrate (f) the long laser pulses produced thermal shock waves in the transparent substrate which resulted in substrate debris being accelerated onto the working substrate Therefore, even though the MELD method did not have the environmental handling problems of the laser organometallic gas method listed above, it still was impractical with earlier available long-pulse lasers.

In the present patent application, for reasons of economy, the phrases metallization and metals refer broadly to other electrically conducting materials such as semiconductor and compound semiconductor materials in addition to common metals such as aluminum, chromium, and copper. Also, both of the words film and laser are used to describe the metals that are deposited upon target substrates. These films in practice are approximately a few hundred angstroms ($10^{-6}$ cm) to a few microns ($10^{-4}$ cm) thick.

BRIEF DESCRIPTION OF THE INVENTION

Disclosed herein is a process for depositing an electrically conductive material onto a working substrate. The method utilizes a target substrate comprising a transparent member having a film of an electrically conductive material supported on its lower surface. The working substrate is placed proximate to the target substrate so that the electrically conductive film is closest to the working substrate. An ultrafast laser pulse is directed onto said target substrate so as to pass through the transparent member and onto the electrically conductive material so as to vaporize a portion of said electrically conductive material and propel a portion of said electrically conductive material toward the working substrate; whereby the propelled material deposits onto the working substrate. In particular embodiments, the laser pulse has a duration of no more than 20 picoseconds. Also disclosed are specific systems for implementing the invention.

BRIEF DESCRIPTION OF THE DRAWINGS

FIG. 1-A schematically shows a prior art process for the laser pulse heating of the thin metal film just before ablation propels the heated metal onto the working substrate.

FIG. 1-B depicts an idealized prior art process, and schematically shows the ablatively driven metal after being resolidified upon the working substrate without lateral heat flow or induced density nonuniformities.

FIG. 1-C depicts an actual prior art process, and schematically shows the ablatively driven metal after being resolidified upon the working substrate but with lateral heat flow and induced density nonuniformities.

DETAILED DESCRIPTION OF THE INVENTION

Reference Numerals in Drawings

2 Thin metal layer being heated under the laser focal spot
3 Example of a uniform thin-metal layer resolidified upon the working substrate
4 Example of a nonuniform thin-metal layer resolidified upon the working substrate
5 Working substrate
6 Transparent target substrate
7 Thin-metal layer bonded to the transparent target substrate
7a–7d Four different thin-metal layers bonded to the transparent target substrate
8 Thick metal layer deposited upon the working substrate
9 Metal vapor in flight
21 Working substrate
22 Computer-controlled shutter
26 Computer-controlled ultrafast laser system
29 Computer control system
30 Computer-controlled positioning platform
32 Metallized tape
33 Focusing lens
35 Computer-controlled metallized tape feed
41 Beam splitter
48 Mask with patterns
50 Target substrate with thin-metal layer on bottom surface
52 Working substrate
54 Deposited thin-metal patterns

I. Precision Metallization Using Ultrafast Laser Pulses

Recent advances in repetitively-pulsed, high-power lasers now makes the MELD process capable of high-precision metallization and practical for microelectronic metallization applications. The new lasers use chirped pulse amplification (CPA) to produce very short ($\leq 20$ ps) pulses at repetition rates up to $10^7$ Hz and energies per pulse up to 10 mJ. The two characteristics most important for MELD metallization are the extremely short pulses and the high repetition rates. These CPA lasers[8] are now referred to as "ultrafast" lasers and this designation is used in the present patent application.

Material removal by ablation, e.g. in drilling and cutting, is a very well studied laser process, but material deposition has received limited study. Recently, Liu[9,10] et al. have used ultrafast lasers to do experiments on cutting and drilling applications and it has been found that these systems provide substantial advantages in precision material removal due to their very short pulses; the reason is that thermal conduction away from the laser focal spot is dramatically reduced compared to that of longer pulse lasers. The same advantages are obtained with ultrafast lasers in MELD metallization.

As mentioned, Q-switched laser pulse lengths ($\approx$10 ns) are too long for the deposition from target substrates as evidenced by the rather strong spreading or "splattering" of the metal deposits. The long pulse length produces detrimental laser heating of the metal vapor after it has lifted off the target substrate. Also, conduction heating of the metal outside of the laser spot produces additional non-uniformities in the metal vapor plasma. Mode-locked lasers produce a series of closely spaced shorter pulses but these pulses are both too close together (a few nanoseconds) to allow moving a new region of metal film under the focal spot. Neither mode-locked nor Q-switched lasers have a high degree of repeatability from pulse to pulse, making them not acceptable in a precision processing system. Also, these lasers only operate at relatively low repetition rates ($\leq 10$ Hz).

The present invention uses the recently developed, repetitively chirped-pulse amplified (CPA) or ultrafast lasers[8] to remedy all of the problems that plagued the earlier multiple-pulse lasers in metallization applications.

It is important to note that very little energy is required to vaporize a small spot-sized quantity of a metal film. For example, consider a chromium film 1 micron thick and a 6 micron diameter spot. The amount of energy required to reach the vaporization temperature of 2945° K is only 0.25 microjoules. For an aluminum film of the same dimensions, the vaporization energy is only about 0.17 microjoules, both are very small compared to the energy capabilities of the now available ultrafast lasers.

The ultrafast lasers are compact (tabletop), repetitively-pulsed, and have ultra-short (0.02 to 20 ps) pulses of high-peak power. A typical set of parameters for an ultrafast laser would have pulse energies of up to 100 $\mu$J and a repetition rate of 1 kilohertz for an average power of 0.1 watts but a peak power during the laser pulse of $10^8$ to $10^9$ watts. Focusing these pulses onto a 6 $\mu$m diameter spot results in an energy flux of $\approx$350 J/cm$^2$, and focused intensities of $\approx 3 \times 10^{14}$–$3 \times 10^{15}$ W/cm$^2$. These intensities and fluences are much higher than are required (see below) for the MELD metallization applications but they demonstrate that the ultrafast lasers far exceed the requirements for metal deposition in the present invention.

The ultrafast laser characteristics are a perfect match for producing precision metal line "writing" on a working substrate. The short pulse length of the ultrafast laser inhibits heating of the metal vapor after it lifts off the substrate thus reducing splattering; it also reduces the non-uniformities caused by the thermal conduction outside of the focused laser spot. The thermal conduction zone spreads out approximately at $d \approx \sqrt{D_T t_L}$ where $D_T$ is the thermal diffusivity of the target metal film and $t_L$ is the laser pulse length. Therefore, the heating outside of the laser spot due to thermal conduction for a 1 picosecond laser pulse is 100 times smaller than for a 10 nanosecond laser pulse.

With a typical metal, e.g. chromium, the thermal conduction distance is roughly $10^{-6}$ cm, whereas the focused laser spot diameter will be a few $10^{-4}$ cm. Actually, because the thermal diffusivity is somewhat greater at the higher temperatures during the laser pulse, the thermal zone is somewhat larger than this, but the heated zone outside of the laser spot is still much smaller for the ultrafast laser pulses compared to the much longer pulses of the usual Q-switched and mode-locked laser pulses of the prior art.

Also important for use in proposed metal deposition processing are the recent developments[11,12] that have demonstrated that diode-pumped, ultrafast lasers[13] (now available using Ti:Sapphire regenerative amplifiers) are becoming more electrically efficient which will, in turn, lead to more economical MELD metallization for photolithographic mask repairs and other microelectronic applications.

Although silicon, glass, and polymers are expected to be the substrates of most interest in the metal deposition applications, other materials are expected to work equally well because they will act as a cold surface on which the metal vapor will resolidify.

It will be noticed that a practical MELD system using an ultrafast laser is, in some ways similar to the laser thermal photo-decomposition metal deposition systems which were mentioned above. However, in the MELD-ultrafast system there are no toxic gases to handle or dispose of. Furthermore, metal deposition is localized to be only directly under the beam spot, as indicated in FIG. 1-B.

Because the metal film is removed from the transparent target substrate after each single laser pulse, a clear viewing port is left behind. This port can be used as a convenient diagnostic view for a microscope in a manually controlled system or with optical sensors to input data to the computer-controlled substrate transport system.

Finally, in the prior art, it was not obvious that very short laser pulses were required for producing precision metal deposits. The physical reason that very short pulses are of crucial importance is that these pulses can be near-optimally matched to both thermal conduction depth and the laser energy deposition depth of thin metal films. This characteristic match is further described below.

II. Ultrafast Laser and Target Substrate Characterization

Nominal estimates for ultrafast laser and metal film quantities are presented for MELD metallization in the present invention. Consider an ultrafast (Ti:Sapphire) laser as a baseline design for a MELD thin-line metal writing application. The estimates given here are based upon some of my previous data at much longer pulse lengths ($\approx$1 nanosecond) and therefore are only a rough guide for the present metallization applications.

The diffraction limited spot size (dlss) for the $\lambda$=790 nm wavelength ultrafast laser using an f/1 focusing lens is $0.64\lambda \approx \frac{1}{2}$ micron. But for the present example, consider a spot diameter to be about ten times the dlss, or about 6 microns; it is possible to reduce this size considerably, perhaps even somewhat below[12] the dlss.

The Table I below lists some laser and metal film quantities for two target metal films, aluminum and chromium. The metal film thickness has been chosen to be 1000 Å in both cases.

TABLE I

| | $\rho$(g/cm$^3$) | m(pg) | $T_V$(° K.) | $E_V$(nJ) | $D_T$(cm$^2$/s) | $x_0$(Å) | $\Delta_s$(Å) |
|---|---|---|---|---|---|---|---|
| Al | 2.7 | 7.6 | 2793 | 17 | 0.96 | 154 | 41 |
| Cr | 7.1 | 20.0 | 2945 | 24 | 0.29 | 85 | 91 |

In Table I, m is the heated mass in picograms, $T_v$ is the vaporization temperature, $E_v$ is the vaporization energy in nanojoules, and $D_T$ is the thermal diffusivity. The distance that thermal energy travels during the $T_L$=1 picosecond laser pulse is given by $x_0=(\pi/2)\sqrt{D_T t_L}$, and $\Delta_s$ is the electromagnetic "skin depth"; both latter dimensions are in angstroms ($10^{-8}$ cm). Notice that the thermal conduction depth is comparable to the electromagnetic skin depth which is expected to be the near-optimal condition for explosively driving the metal vapor forward. Furthermore, with a one microjoule laser pulse and just 10% of the energy on the film absorbed (up to 90% reflected), the energy deposited is still roughly 4 to 6 times the vaporization energy for the metal film. The energy in excess of the vaporization energy produces temperatures on the order of a few eV (a few times 11,400° K) which in turn provides the pressure and forward propulsion of the metal vapor.

III. Maskless Embodiments Using Metallized-Tape Target Substrates

One embodiment of the present invention produces a thin metal line to be "drawn" upon the working substrate by continuously moving a metallized tape into the laser focus and continuously moving the working substrate under the focal spot. In this embodiment, the laser beam diameter determines the metal deposition dimension, i.e., no additional mask is required to delineate the deposition region.

Figure 2:
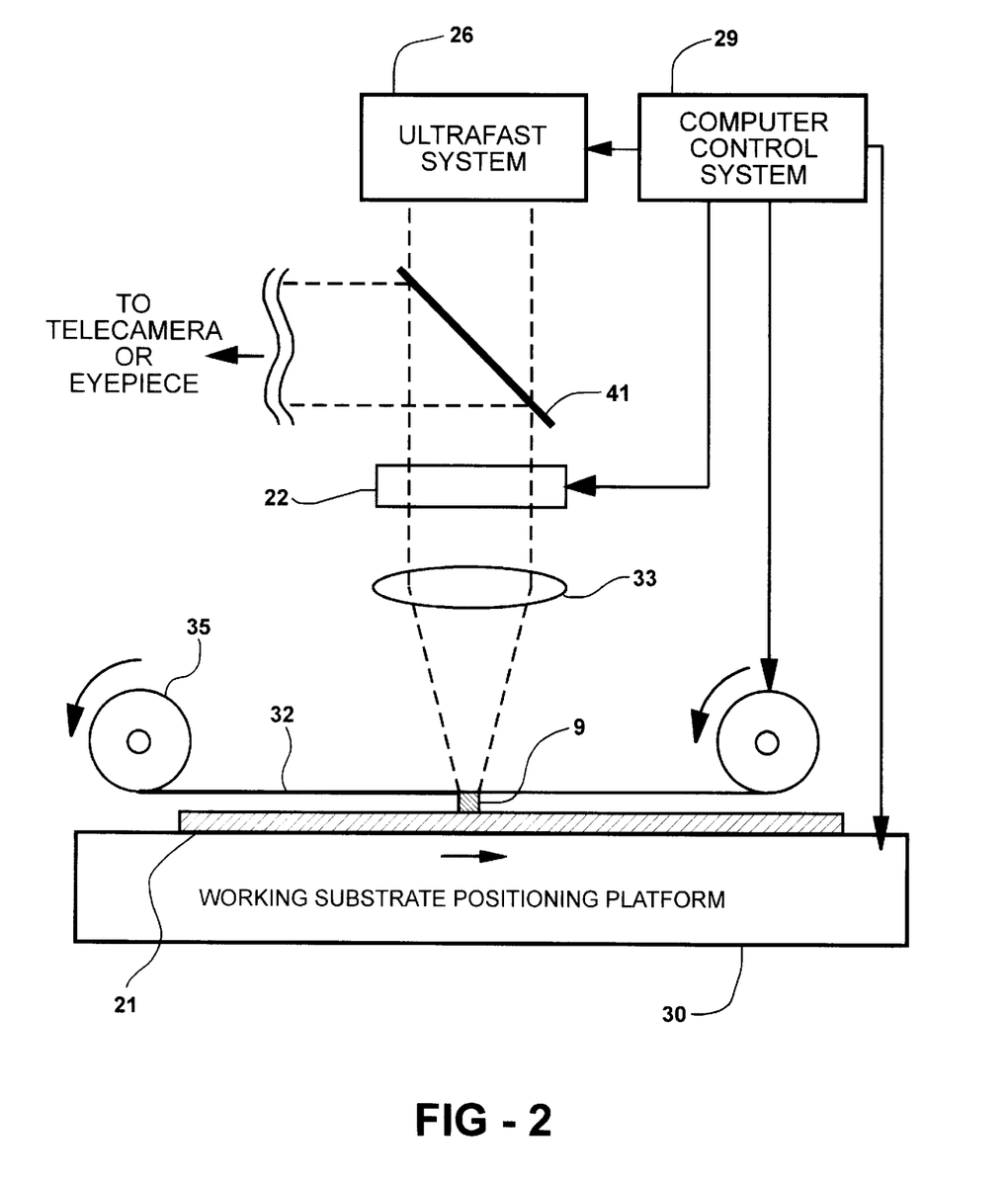
FIG. 2 schematically shows one embodiment of the present invention that provides a computer controlled positioning of the target substrate (a metallized tape) and the working substrate for metal writing. For clarity, the target-to-working substrate separation has been exaggerated.

Using the ultrafast laser quantities chosen above, namely 1 $\mu$J, 1 ps ultrafast laser pulses, the focused intensity is about $3.5 \times 10^{12}$ W/cm$^2$, roughly the limit above which breakdown at the surface of the transparent substrate would prevent transmission to the metal film. These intensities are comparable to some previous experiments[2,3], except that with the ultrafast laser, the focal spot is very much smaller and, most important, a continuous sequence of micro-explosive depositions is easily produced. Therefore, this embodiment consists of a continuously moving working substrate and a film-transport system that produces a controlled deposition of a metal thin film onto the working substrate. This embodiment is shown schematically in FIG. 2. The ultrafast laser system 26 is computer controlled as is a shutter 22. A beam-splitter 41 is provided for either microscope or telecamera viewing of the deposition region. The target substrate 32 is a metallized tape fabricated from either a glass or polymer material on the bottom of which the metal film has been deposited (similar to metallized Mylar). The metallized tape feed system 35 is controlled by computer system 29 and moved at speeds of a few centimeters per second. The working substrate 21 is mounted on a transport positioning platform 30 which allows computer controlled motion in the x-y plane perpendicular to the laser axis. Moving the tape a distance equal to the focal spot, e.g., 6 $\mu$m, between laser pulses at 1 kHz, produces a line writing rate of 0.6 cm/s. Higher writing rates are possible, and both the substrate transport and tape transport feeds can be easily adapted from commercially available lasers and materials handing hardware and software.

Although glasses, polymers, and silicon are expected to be the substrates of most interest in the metal-writing applications, other materials should work equally well because they will act as a cold surface on which the metal vapor will impact and resolidify. The adhesion of the re-deposited films will be predetermined by experiment. For example, recent single-pulse, ultrafast laser experiments by Bullock[17] et al. have shown very good aluminum adhesion to a glass working substrate.

The target substrate transport system for MELD-metal writing is similar to laser photochemical metal deposition in that linear transport and position control are required. However, in the MELD-metal writing process there are no toxic gases to handle or dispose of. Furthermore, metal deposition is localized to be only directly under the beam spot, and there is no metal vapor spill-over onto other areas of the substrate; spill-over is a problem for long-pulse laser metal deposition and requires additional processing in most applications.

Another practical benefit of the present invention derives from the fact that a clear viewing port is created under the focal spot where the metal film is removed from the target substrate after each single laser pulse. This port may be used as a convenient diagnostic view-port for a microscope in a manually controlled system or with an optical sensor or telecamera to input data to the computer-controlled substrate transport system.

Figure 3:
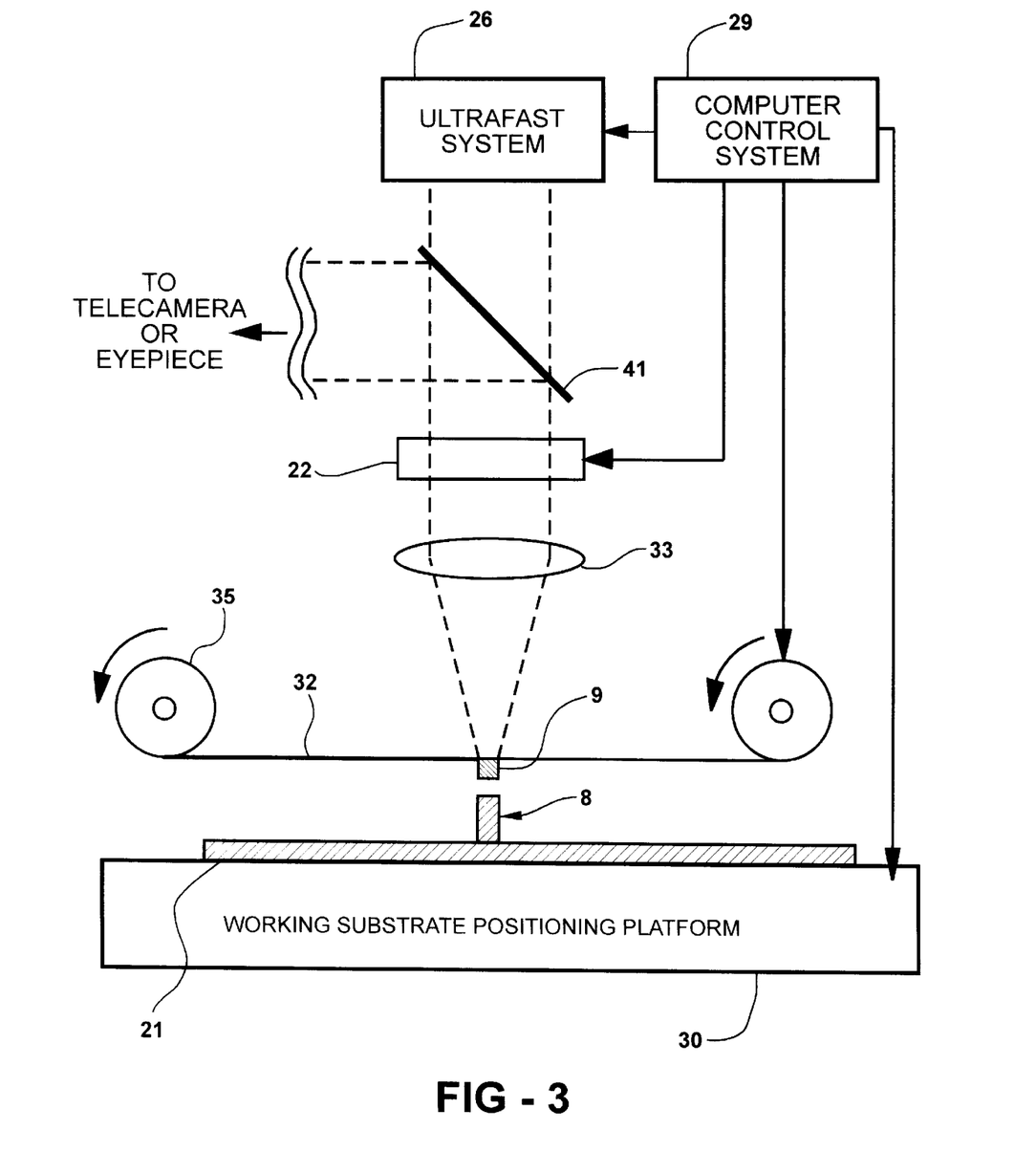
FIG. 3 schematically shows another embodiment of the present invention that provides computer controlled positioning of the target substrate (a metallized tape) and the working substrate for deposition of thicker metal features. For clarity, the target-to-working substrate separation has been exaggerated.

Another embodiment of the present invention, shown schematically in FIG. 3, is realized when the working substrate 21 is allowed to remain in the same position for a sequence of ultrafast laser pulses while the metallized tape 32 continuously moves new metal under the focal spot. This produces repeated depositions one upon the next yielding a thicker deposited metal layer. The lateral size of the deposit 8 is roughly equal to the laser spot size but the depth of the deposit is determined by the number of accumulated pulses. Repeated depositions permit build-up of the metal upon the working substrate that can be quite deep. For example, using the ultrafast laser parameters and metal film thicknesses of 1 kHz and 1000 Å produces a metal deposit $10^{-2}$ cm thick in one second. This is a very rapid metal deposition rate when compared to common metallization processes such as electron or ion beam evaporative deposition. As in the previous embodiment, this embodiment uses the ultrafast laser system 26, the shutter 22, and the metallized tape feed 35, that are all controlled by computer system 29.

In some embodiments of the present invention, the working substrate may be in direct contact with the target substrate, in others, a substantial gap between the two substrates may be acceptable and is predetermined by experiment. Some embodiments may employ metal layers that are composed of precious metals such as gold, silver, platinum and palladium. Additional embodiments may use metals that are toxic or radioactive such as beryllium, uranium, thorium and plutonium. These latter two embodiments are of practical value because of the precise control of amounts and size of the deposited metals and the ease of recovery of unused metal layer materials.

Figure 5:
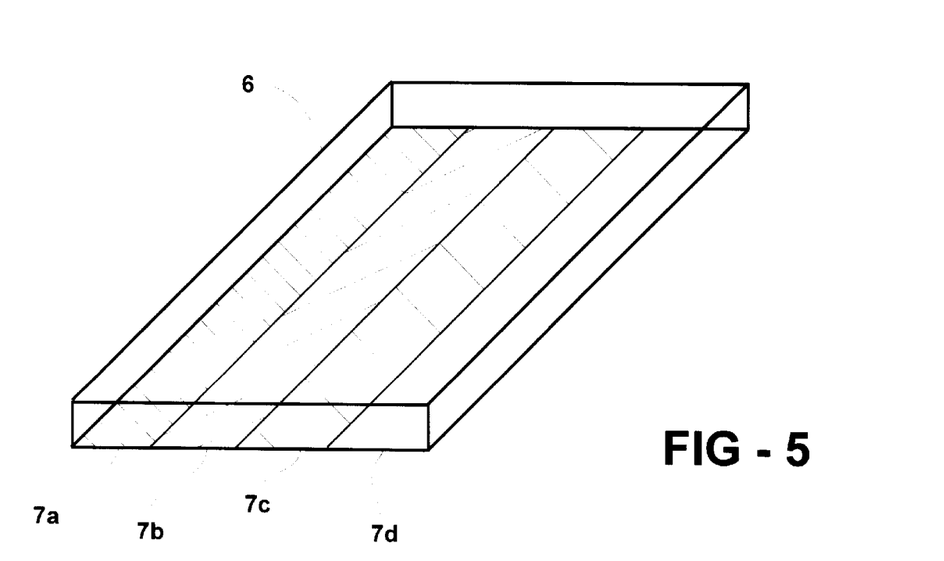
FIG. 5 schematically shows a target substrate comprised of four different thin metal layers. This configuration may use a plurality of such strips of metal layers.

Finally, all embodiments of the present invention may make use of structured target substrates wherein different metal strips are deposited upon the same transparent substrate 6 as shown schematically in FIG. 5 (not shown). Here, four such metal layers 7a–7d are shown side by side. For example, using a strip of copper, a strip of carbon, and two strips of semiconductor for the target substrate would allow spatial deposition of a transistor and resistor network by sequentially depositing conducting and semiconducting materials in a predetermined fashion upon the working substrate. Such structured target substrates allow spatially or compositionally discreet deposits to be made upon working substrates.

IV. Embodiments Using Masks

Figure 4:
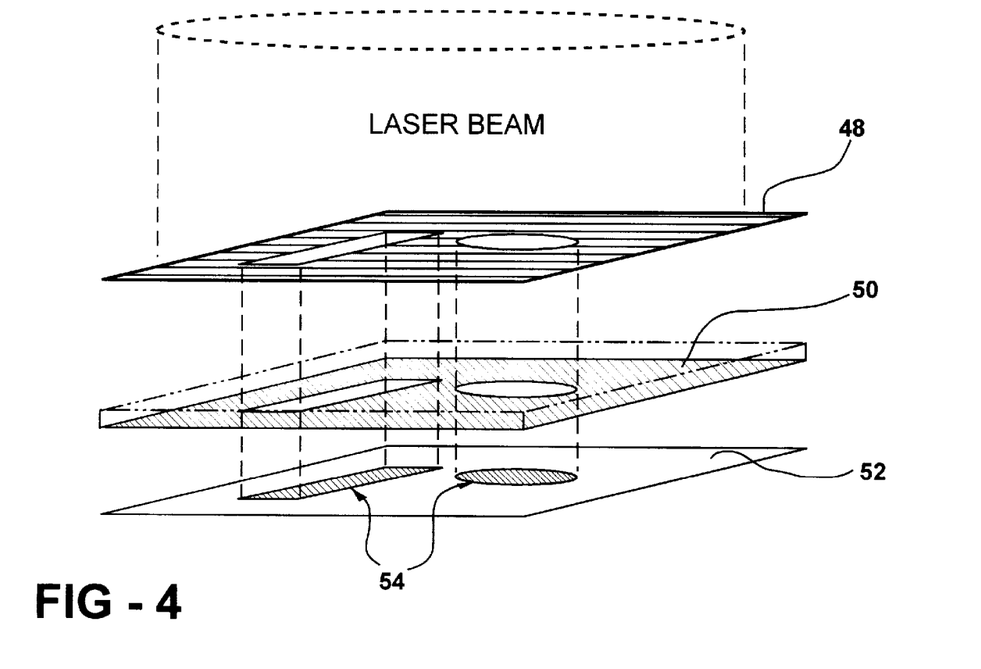
FIG. 4 schematically shows another embodiment of the present invention that makes use of a mask for patterning metal deposits with a single ultrafast laser pulse. For clarity, the mask-to-target substrate and the target substrate-to-working substrate separations have been exaggerated.

Another embodiment of the present invention is shown schematically in FIG. 4. The ultrafast laser running at a relatively slow pulse rate can produce much higher energy pulses, e.g., tens of millijoules or more, rather than the 1 $\mu$J pulses of the previous embodiments. A MELD metallization pattern can be produced in a single higher-energy pulse rather than multiple laser pulses by masking the beam in areas away from the selected deposition regions. A focal spot diameter of 600 $\mu$m and a laser pulse of 10 mJ has the same energy per unit area (3.5 J/cm$^2$) as the multiple pulse, maskless depositions described previously. This masked embodiment is shown in FIG. 4. A mask 48 is introduced into the laser beam having clear regions where metallization is desired and opaque where no metal deposit is desired. Those regions clear to the laser beam are transmitted through to the target substrate 50, heat the thin-metal layer in those regions and explosively transfer the patterned metal 54 to be deposited upon the working substrate 52.

Another advantage of the present invention is the possible recovery and recycling of the unused metal from the target substrate. This may be particularly important when depositing costly metals such as gold or platinum.

From the description above, a number of advantages of my present invention become evident for embodiments with masks or without masks:

(a) there are no toxic chemicals to handle and dispose of
(b) ultrafast lasers provide the highly repeatable and precise sequence of laser pulses required for precision metallization
(c) ultrafast lasers in MELD metallization produce uniform density deposits
(d) MELD metallization with ultrafast lasers is a fast deposition process
(e) very short laser pulse lengths of ultrafast lasers produce no detrimental thermal conduction heating outside of the focal spot
(f) very short laser pulse lengths of ultrafast lasers can be optimally matched to the laser light absorption distance and the conduction heating distance in the target substrate metal layers
(g) the laser focal spot dimension may be precisely controlled
(h) no late-time debris is generated from the target substrate
(i) recovery, for recycling, of unused metals from target substrates is simple and efficient The present invention allows the precision deposition of metal films both from single and multiple ultrafast laser pulses. The invention allows patterned metal films to be produced upon substrates using either a patterning mask or by repeatedly moving the target substrate and working substrates in a manner such as to produce patterns controlled by this motion.

Although the description above contains many specifications, characterizations, and embodiments of the process, these should not be construed as limiting the scope of the invention. For example, although the embodiments using essentially flat substrates are presented, embodiments employing curved and even complex-shaped substrates may also be used. In addition, although computer control is employed in some embodiments, a manual positioning of the target and working substrates may also be used. In further addition, the target substrate metallized tapes may carry a number of different metals spatially separated on the tape as shown schematically in FIG. 5 (not shown). For example, the target substrate tape might carry a strip of copper film, two strips of doped silicon films, and a strip of carbon film. Such a target substrate tape would allow the deposition of various transistors, resistors, and interconnections all constructed by computer-controlled depositions upon the working substrate.

Thus, the scope of the present invention should be determined by the appended claims and their legal equivalents, rather than by the examples given.

Technical References (1) K. G. Ibbs and R. M. Osgood (Eds.), *Laser and Chemical Processing for Microelectronics,* Cambridge, U.K., Cambridge University Press (1989).

(2) F. J. Mayer and Gar. E. Busch, "Plasma production by laser-driven explosively heated thin metal films," *Journal of Applied Physics,* 57, 827 (1985).

(3) A. B. Bullock, P. R. Bolton, and F. J. Mayer, "Time-integrated reflectivity of laser-induced back ablated aluminum thin film targets," *Journal of Applied Physics,* 82, 1828 (1997).

(4) F. J. Adrian, J. Bohandy, B. F. Kim, and A. N. Jette, "A study of the mechanism of metal deposition by the laser-induced forward transfer process," *Journal of Vacuum Science and Technology* B 5, 1490 (1989).

(5) Z. Toth, T. Szorenyi and A. L. Toth, "Ar$^+$ laser-induced forward transfer (LIFT): a novel method for micrometer-size surface patterning," *Applied Surface Science* 69, 317 (1993).

(6) H. Esrom, J. Y. Zhang, U. Kogelschatz and A. J. Pedraza, "New approach of a laser-induced forward transfer for deposition of patterned thin metal films," *Applied Surface Science* 86, 202 (1995).

(7) R. J. Baseman, A. Gupta, R. C. Sausa and C. Progler, in: *Laser and Particle Beam Chemical Processing for Microelectronics,* Eds. D. J. Ehrlich, G. S. Higashiand and M. M. Oprysko, Materials Research Society Symposium Proceedings 101, 237 (1988).

(8) M. D. Perry and G. Mourou, *Science* 264, 917 (1994).

(9) X. Liu, D. Du, and G. Mourou, *J. Quantum Electronics* 33, 1706 (1997).

(10) X. Liu and G. Mourou, *Laser Focus World,* August 1997, pg. 101.

(11) for example, see R. Cunningham's article "Spotlight on Ultrafast Lasers" in *Lasers & Optronics,* 15, No. 6, June 1996.

(12) W. H. Knox, "Practical Lasers Will Spawn Varied Ultrafast Applications" in *Laser Focus World,* pg. 135, June 1996.

(13) Clark-MXR Inc., Dexter, Mich., also the following publication, P. Bado, D. Du, E. F. Gabl, Y. Pang, E. Canto-Said, "Reliable Compact Ultrafast Sources," Ultrafast Phenomena, Tenth International Topical Meeting, May 28–Jun. 1, 1996.

I claim:

1. A process for precision deposition of electrically conducting films on a working substrate comprising the steps of:
   (a) selecting said working substrate,
   (b) providing a target comprised of a transparent substrate having an electrically conducting film supported upon a lower surface thereof,
   (c) positioning said working substrate at a distance from, and next to, said electrically conducting film,
   (d) providing an ultrafast laser,
   (e) directing an ultrafast laser pulse of sufficient energy from said ultrafast laser through said transparent substrate's upper surface and onto said electrically conducting film so as to vaporize said electrically conducting film over a size substantially equal to the focal spot size of said ultrafast laser pulse, such that said vaporized electrically conducting film material is propelled toward, and deposited upon, said working substrate,
   whereby a deposit of said electrically conducting film is produced upon said working substrate.

2. A process of claim 1 wherein said electrically conducting film is comprised of (1) a metal such as aluminum, chromium, copper, and nickel, or (2) a semiconductor such as silicon, germanium, and carbon, or (3) a compound semiconductor such as gallium arsenide, indium antimonide, and cadmium telluride.

3. A process of claim 1 further including: providing a patterned mask having regions which are opaque to said ultrafast laser pulse in regions which are transparent to said ultrafast laser pulse, said mask being positioned so as to provide geometrical shape control of said ultrafast laser pulse and the electrically conducting film deposit upon said working substrate.

4. A process of claim 1 including directing a sequence of said ultrafast laser pulses onto said electrically conducting film, and advancing said target substrate between successive pulses so as to deposit a plurality of said electrically conducting film deposits, sequentially overlaid, upon said working substrate.

5. A process of claim 1 including directing a sequence of said ultrafast laser pulses onto the electrically conducting film, and advancing said target substrate and said working substrate between successive pulses such that a pattern of said electrically conducting film material is deposited upon said working substrate.

6. A process of claim 5 wherein said electrically conducting film is composed of a plurality of strips of conducting materials chosen from the groups of (1) metals such as aluminum, chromium, copper, and nickel, (2) semiconductors such as silicon, germanium, and carbon, or (3) compound semiconductors such as gallium arsenide, indium antimonide, and cadmium telluride, or (4) other electrically conducting materials, such that predetermined, compositionally discrete, surface patterns of electrically conducting films are deposited upon said working substrate.

7. A process for making precision thin metal deposits upon a working substrate, comprising the steps of:
   (a) selecting an ultrafast laser capable of multiple laser pulses with a pulse duration of less than 20 picoseconds,
   (b) providing a target comprised of: (1) a substrate transparent to said laser pulses, and (2) a thin metal layer absorptive to said laser pulses and supported by said transparent substrate, (c) providing a means of positioning said working substrate next to, and at a distance from, said thin metal layer of said target, (d) providing a means of translating said target substrate and said working substrate between said ultrafast laser pulses, (e) focusing said laser pulses of sufficient energy through said transparent substrate unto said thin metal layer to vaporize said thin metal layer over a size substantially equal to the focal spot size of said laser pulses, such that vaporized metal is propelled onto, and resolidifies upon, said working substrate, whereby a metallized pattern is produced upon the working substrate.

8. A process of claim 7 further including providing a structured thin metal layer composed of a plurality of distinct zones of different metals chosen from: (1) common metals, (2) semiconductor materials, and (3) compound semiconductor materials, (4) other electrically conducting materials.

9. A process of claim 7 further including providing a mask opaque to said laser pulses in predetermined regions and transparent in other predetermined regions positioned on the transparent substrate side of the target substrate such that metallization is deposited upon the working substrate only in the transparent regions of said mask.

10. A process of claim 7 further including providing said thin metal layer composed of precious metals such as gold, silver, platinum, and palladium.

11. A process of claim 7 further including providing said thin metal layer composed of toxic or radioactive conducting materials such as beryllium, uranium, thorium, and plutonium.

* * * * *